United States Patent [19]

Chandley

[11] Patent Number: 5,607,007
[45] Date of Patent: Mar. 4, 1997

[54] DIRECTIONAL SOLIDIFICATION APPARATUS AND METHOD

[75] Inventor: George D. Chandley, Amherst, N.H.

[73] Assignee: Hitchiner Manufacturing Co., Inc., Milford, N.H.

[21] Appl. No.: 325,898

[22] Filed: Oct. 19, 1994

[51] Int. Cl.⁶ .................................................. B22D 27/04
[52] U.S. Cl. .................................. 164/122.2; 164/338.1; 164/361
[58] Field of Search ............................ 164/122.1, 122.2, 164/338.1, 338.2, 529, 361

[56] References Cited

U.S. PATENT DOCUMENTS

| | | | |
|---|---|---|---|
| 3,204,303 | 9/1965 | Chandley | 164/361 |
| 3,376,915 | 4/1968 | Chandley. | |
| 3,441,078 | 4/1969 | Chandley. | |
| 3,754,592 | 8/1973 | Mullen. | |
| 3,926,245 | 12/1975 | Kanaby. | |
| 3,981,344 | 9/1976 | Hayes et al. | 164/516 |
| 4,774,992 | 10/1988 | George | 164/122.1 |
| 4,791,977 | 12/1988 | Chandley. | |
| 4,875,518 | 10/1989 | Imura et al. | 164/122.1 |
| 5,042,561 | 8/1991 | Chandley. | |

FOREIGN PATENT DOCUMENTS 64-53756  3/1989  Japan ................................. 164/122.1

Primary Examiner—Kuang Y. Lin
Attorney, Agent, or Firm—Edward J. Timmer

[57] ABSTRACT

Method and apparatus for directional solidification (e.g columnar grain or single crystal casting) of a melt involves refractory particulates, such as SiC particles, provided about at least one article molding cavity region of a casting mold wherein the particulates are heated to an elevated temperature above a melt casting temperature. The article molding cavity region of the casting mold is heated from an initial preheat temperature to an elevated casting temperature by heat from the particulates prior to communication of the article molding cavity to a chill member. For single crystal casting, a radiation transparent crystal selector member is disposed in a mold grain nucleation and growth cavity located between the article molding cavity and the chill member to select a single crystal for propagation in the article molding cavity region. A melt permeable, thermal insulation member may be disposed between the mold grain nucleation and growth cavity region and the chill member.

23 Claims, 4 Drawing Sheets

DIRECTIONAL SOLIDIFICATION APPARATUS AND METHOD

FIELD OF THE INVENTION

The present invention relates to the directional solidification of molten material, such as for example metals, alloys and eutectics, to make columnar grain, single crystal and other castings having directionally oriented microstructure in a reduced overall casting cycle time.

BACKGROUND OF THE INVENTION

The directional solidification of molten material, such as metals, alloys, and eutectics, by unidirectional heat removal from the molten material is well known to impart a directionally oriented grain or microstructure to the solidified castings and is commonly employed in the manufacture of high temperature superalloy turbine blade and vane castings for use in the hot turbine section of gas turbine engines. For example, polycrystalline directionally solidified turbine blades and vanes exhibit a columnar grain structure wherein the grains extend in a preferential loading direction of the blade or vane, while single crystal turbine blades and vanes comprise only a single grain selected and propagated in a preferential loading direction of the blade or vane. Directionally solidified eutectics comprise one or more phase components preferentially aligned in a selected direction of the solidified casting.

In commonly used directional solidification processes, a ceramic investment mold assembly is mounted on a water-cooled copper chill plate U.S. Pat. No. 3,376,915 movable relative to a casting furnace. The mold assembly mounted on the chill plate is positioned in the susceptor of a casting furnace and preheated to a desired elevated temperature for casting by energization of one or more induction coils disposed about the furnace. The induction coils heat a graphite or similar susceptor in the furnace that, in turn, heats the mold assembly to the casting temperature. Molten material, such as a superalloy melt at a selected superheat then is gravity poured into the preheated mold assembly for directional solidification. Directional solidification can be effected by the well known "power down" technique wherein the induction coils are deenergized in controlled manner to establish a desired thermal gradient in the melt in combination with the copper chill plate and/or the "withdrawal" technique wherein the melt-filled mold assembly is withdrawn from the susceptor at a controlled rate to this same end. The Chandley U.S. Pat. No. 3,376,915 discloses the power down and mold withdrawal techniques.

Although directional solidification processing is widely used in the manufacture of columnar grain and single crystal turbine blades and vanes, there is a desire to reduce the overall casting cycle time in order to reduce casting costs. Of special interest in this regard is the manufacture of relatively long single crystal turbine blade and vane castings having relatively massive root sections where a "pigtail" crystal selector passage is provided proximate the bottom of each mold between a lower grain nucleation/growth cavity and a mold cavity thereabove configured to form the desired casting. In particular, the pigtail crystal selector passage typically has a small cross-section and helical configuration in order to select a single crystal in the nucleation zone for propagation through the mold cavity thereabove to form a single crystal casting. However, for relatively long turbine blade and vane castings having relatively massive root sections, the pigtail crystal selector passage is disadvantageous from a heat removal standpoint and can result in relatively long times for achieving directional solidification of the melt in the mold.

SUMMARY OF THE INVENTION

One embodiment of the present invention provides a method of directional solidification of a melt involving providing refractory particulates, such as relatively thermally conductive SiC particles, about at least one article molding cavity region of a casting mold, the particulates being at an elevated temperature above a melt casting temperature (e.g. above the melting temperature of the material being cast), heating the article molding cavity region of the casting mold from an initial preheat temperature to the melt casting temperature by heat from the particulates, communicating the article molding cavity region to a heat removal member in a manner to directionally solidify melt introduced therein, and introducing the melt to the article molding cavity region in communication with the heat removal member to directionally solidify it in the article molding cavity.

The particulates can be preheated above the melt casting temperature apart from the article molding cavity region of the casting mold and then placed about the article molding cavity region. Alternately, the particulates can be placed about the article molding cavity region, and the particulates heated in-situ about the article molding region of the casting mold. For purposes of illustration, the particulates are disposed in a tubular susceptor disposed about each article molding cavity region, and the susceptor is heated by induction coil means to heat the particulates.

In an embodiment of the invention for casting a single crystal article, a radiation transparent crystal selector member is disposed in a mold grain nucleation and growth region located between the article molding cavity and the heat removal member to select a single crystal for propagation in the article molding cavity. The radiation transparent crystal selector member preferably comprises quartz.

In another embodiment of the invention for casting a directionally solidified article, a melt permeable, thermal insulation member is disposed between the grain nucleation and growth region located between the article molding cavity and the heat removal member. The thermal insulation member may include a crystal nucleator passage therein.

In an embodiment of the invention for countergravity casting a melt into the casting mold, a casting mold is disposed on one or more chill members with a fill tube of the mold extending downwardly through a space in the chill member(s) toward an underlying source of melt and with at least one article molding cavity communicated to a heat removal member in a manner to directionally solidify melt introduced in said molding cavity from the fill tube, and the article molding cavity is evacuated to countergravity cast the melt from the underlying source through the fill tube into the article molding cavity.

The present invention will become more readily apparent from the following detailed description taken with the following drawings.

DETAILED DESCRIPTION OF THE INVENTION

Figure 1:
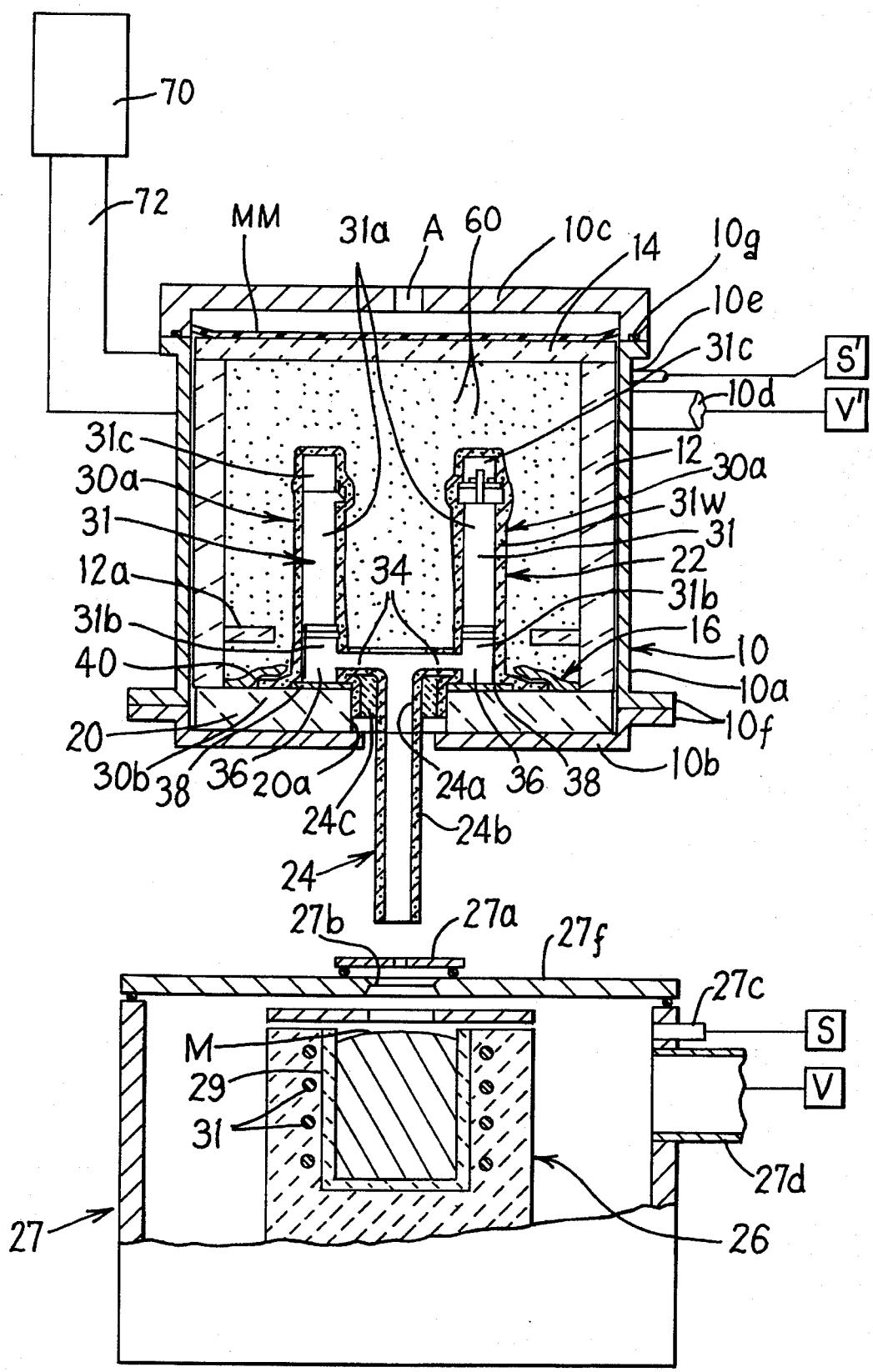
FIG. 1 is a side elevation of one embodiment of apparatus of the invention.
Figure 2:
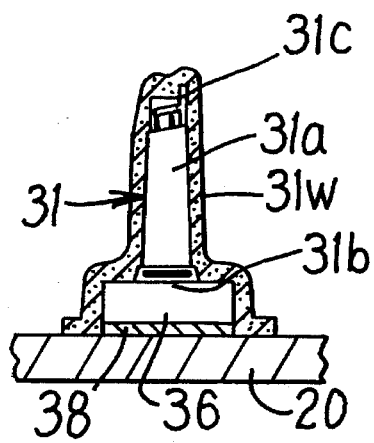
FIG. 2 is a partial sectional view of one article molding cavity of the casting mold for making a columnar grain casting.

One illustrative embodiment of the present invention is shown in FIGS. 1–2 for making columnar grain castings by directional solidification of a metal, alloy, or eutectic melt in a casting mold. This embodiment is offered merely to illustrate and not limit the present invention in any way. Referring to FIGS. 1–2, apparatus for making columnar grain castings pursuant to this embodiment includes a metallic (e.g. steel) casting container 10 comprising a cylindrical sleeve 10a and an annular bottom wall 10b held together at mating flanges 10f by suitable mechanical clamping device, such as a hydraulically powered clamp (not shown). An annular fiber thermal insulation sidewall sleeve 12 and removable fiber thermal insulation cover 14 are disposed in the container 10. The fiber insulation comprises Kaowool® ceramic (e.g. alumina or alumina/silica fibers) insulation or other suitable thermal insulation material. The container sleeve 10a includes an open bottom 16 adapted to receive an annular water cooled chill member 20 (heat removal member) made of copper or other highly heat conductive material. The chill member 20 may include one or more chill members or segments that form a central space or opening 20a therein and is supported by container bottom wall 10b.

A one-piece ceramic investment shell mold assembly 22 is shown disposed on the chill member 20 in the container 10 such that a centrally disposed melt inlet tube 24a and fill tube 24b of the mold assembly extend downwardly through the chill member opening 20a toward an underlying source 26 of melt to be cast (e.g. a melt filled crucible 29 disposed in enclosure 27 as shown in U.S. Pat. No. 5,042,561, the teachings of which are incorporated herein by reference). Thermal insulation 24c is disposed about the inlet tube 24a. The casting mold assembly 22 typically includes a plurality molding cavity regions 30a arranged circumferentially about the central inlet tube 24a and that define therein article molding cavities 31 configured in the shape of the casting to be made. Although two molding cavity regions 30a are shown in FIG. 1 at 3 and 9 o'clock positions relative to the inlet tube 24a, two or other additional and like molding cavity regions are present (but not shown) and reside at 12 and 6 o'clock positions relative to the inlet tube 24a. Each molding cavity 31 receives melt from the inlet and fill tubes 24a, 24b via a respective horizontal ingate passage 34 disposed between the inlet tube 24a and individual cavities 31. Each ingate passage 34 communicates to a lowermost grain nucleation and growth cavity 36 of each mold. As is apparent, each article molding cavity 31 is communicated to the chill member 20 by the mold grain nucleation and growth cavity 36. This communication provides unidirectional heat removal from the melt in the article molding cavities 31 to achieve directional solidification of the melt residing in each article molding cavity 31 in known manner.

In FIG. 1, each article molding cavity 31 is shown configured as an airfoil shaped cavity section 31a interconnected to a lower root shaped cavity section 31b with a riser section 31c at the uppermost end, the grain nucleation and growth cavity 36 being disposed below the root shaped cavity section 31b. However, the invention is not limited to any particular article molding cavity shape and can be practiced to cast a wide variety of casting configurations. Moreover, the invention is not limited to the investment shell mold described and can be practiced using other types of casting molds.

The mold assembly 22 can be made as one-piece by the well known lost wax method wherein wax or other fugitive patterns (e.g. wax patterns) of the mold components, such as a pattern of the article molding cavities 31, ingate passages 34 and inlet tube 24a are assembled and repeatedly dipped in a ceramic slurry, drained and stuccoed with coarse ceramic stucco until a desired shell mold thickness is formed. The invested mold assembly then is subjected to a conventional pattern removal operation, such as heating, dissolution, and the like to melt or otherwise selectively remove the fugitive pattern material (e.g. wax) from the invested ceramic shell and fired in usual manner to develop mold strength for casting. The fill tube 24b of suitable ceramic material, such as quartz for casting nickel base alloys, can be attached by ceramic adhesive to the inlet tube 24a. The walls 31w of the investment shell mold assembly defining the molding cavities 31 are gas permeable to enable evacuation of the article molding cavities 31 in the manner described herebelow to effect countergravity casting of the melt into the molding cavities 31.

A melt permeable, fiber thermal insulation member 38 is placed in a respective recess 30b in the mold base beneath each molding cavity 31. The insulation member 38 is typically Kaowool® insulation about 0.4 inch in thickness and is sized laterally to span across the bottom opening of each grain nucleation and growth cavity 36.

Prior to casting, the fired mold assembly 22 is preheated to an elevated temperature (e.g. 1150° C.) near but less than the actual selected melt casting temperature (e.g. 1300° C. and above for INCO 738 nickel base alloy) in a separate mold preheat furnace (not shown). The mold assembly 22 is preheated on a refractory thermal insulation support block (not shown), such as an alumina fiber support block in a conventional furnace. The preheated mold assembly 22 is removed manually from the furnace and immediately placed on the chill member 20 residing on the container bottom wall 10b. The sleeve 10a then is lowered to locate and rest the sleeve flange on the horizontal flange of the bottom wall 10a as shown in FIG. 1. In the mold assembly position shown, the fill tube 24b extends downwardly through space 20a, and each article molding cavity 31 is communicated to the chill member 20 via the respective grain nucleation and growth cavity 36 and the respective melt permeable, fiber thermal insulation member 38 disposed between the grain nucleation and growth cavity 36 and the chill member 20. The fiber insulation member 38 provides thermal insulation until the melt cast into the cavities 31 penetrates its pores and contacts the chill member 20 so as to cause heat transfer and directional solidification.

As soon as the preheated mold assembly 22 is positioned on the chill member 20 in the container 10 and the container sleeve 10a is located on the bottom wall 10b, preheated thermally conductive particulates 60 (e.g. SiC particles of 50 mesh size) are introduced through the open lid 10c of the container 10 about the article molding cavities 31 as shown in FIG. 1. The sleeve 12 may include an annular shelf 12a to help contain the particulates 60 to some extent. The SiC particulates 60 are preheated in a separate furnace (not shown) to a temperature above the melt casting temperature (e.g. 1590° C.) and thus above the preheat temperature of the article molding cavities 31 (e.g. 1150° C.) so that over a short time of contact, the preheated particulates 60 heat the article molding cavity regions 30a (i.e. walls 31w) to the desired melt casting temperature (e.g. above the melting temperature) for a particular melt composition to be cast (e.g. 1320° C. for casting INCO 738 nickel base alloy).

The preheated particulates 60 are heated in a SiC vessel that is transported by a manipulator (not shown), such as a conventional load leveller, to the container 10 to pour the preheated particulates 60 into sleeve 12 about the preheated mold assembly 22. Prior to introduction of the preheated particulates 60, an annular fiber thermal insulation cover 40 typically is placed to overlie the outer periphery of the mold assembly 22 as shown. This cover 40 prevents preheated SiC particulates 60 introduced into the container 10 about the article molding cavities 31 from penetrating under the foot or base of the mold assembly 22 that rests on the chill member 20.

After the preheated particulates 60 are placed about the article molding cavities 31 in the container 10 as shown in FIG. 1, the thermal insulation cover 14 quickly is placed on the sleeve 12. The vacuum-tight lid 10c hinged to the container 10 is closed to seal by seal 10g on the upper flange of container 10 over the top cover 14. The lid 10c includes central aperture A communicated to ambient atmosphere and a flexible, gas impermeable membrane MM that presses on thermal insulation cover 14 when a vacuum is drawn in the container 10 via conduit 10d. Pressure on the cover 14 causes it to flex and rigidize the SiC particles 60 about the molding cavity walls 31w during casting.

In a short time (e.g. five minutes), contact of the preheated particulates 60 with the mold cavity regions 30a raises the temperature of the walls 31w to the desired melt casting temperature (e.g. above the alloy melting temperature such as 1320° C. for INCO 738 nickel base alloy) and maintains the casting temperature until the mold assembly 22 can be cast. The required time of contact to bring the molding cavity walls 31w up to the desired casting temperature will vary with the preheat temperature of the mold assembly 22 and the particulates 60, the heat conductivity and mass of the particulates 60, the thickness of the mold cavity walls 31w as well as other factors. For purposes of illustration only, a ¼ inch thick layer of SiC particles (50 mesh) at 1590° C. disposed about a ceramic shell mold at 1150° C. will heat a ⅛ inch thick shell mold wall to 1320° C. in five minutes. The contact time required between the preheated particulates 60 and the preheated regions 30a to impart the desired casting temperature to the molding cavity walls 31w can be readily determined empirically.

The container 10 and its contents are then moved by a hydraulic actuator 70 and arm 72 connected to the container 10 toward the aforementioned enclosure 27 to immerse the fill tube 24b in the melt M, FIG. 1. The container 10 includes conduit 10d that is communicated to a vacuum pump V' to establish a relative vacuum in the container. Another conduit 10e is also provided and communicated to a source S' of argon or other inert gas.

In FIG. 1, the container 10 is shown located above the enclosure 27. The enclosure 27 includes a removable cover 27a which is removed to allow insertion of the fill pipe 24b through opening 27b in sealed lid 27f and immersion of the fill pipe 24b in the melt M in the crucible 29 residing in the enclosure. The enclosure 27 and cover 27a are of the type described with respect to FIG. 4 of U.S. Pat. Nos. 4,791,977 and also 5,042,561, the teachings of which are incorporated herein by reference to this end.

The melt M is provided in crucible 29 under a substantially air-free atmosphere of inert gas. When cover 27a is removed before the casting operation commences, entrance of air into the crucible enclosure 27 through opening 27b is prevented by maintaining a flow of the inert gas above atmospheric pressure through conduit 27c connected to inert gas source S. With an inert gas such as argon, several times as dense as air, the gas flow may be easily controlled to prevent entry of air into enclosure 27 through opening 27b.

In the process of casting with the apparatus of FIG. 1, the container 10 is moved in a two-stage operation toward the enclosure 27. The first stage inserts the fill pipe 24b through opening 27b and stops the relative motion when the fill pipe 24b is immersed in the inert gas atmosphere above the surface of the melt M in the crucible 29. The inert gas atmosphere is provided via conduit 27c connected to inert gas source S. During a dwell at this position, the container 10 is evacuated through conduit 10d and vacuum pump V' only to a low vacuum (e.g. 2 inches of Hg) required to cause inert gas in the crucible enclosure 27 to flow through the tubes 24a, 24b, mold assembly 22 and container 10, purging them of air. During this stage, additional inert gas can be admitted to the container 10 via conduit 10e and inert gas source S' to aid in flushing of the container 10 and its contents.

After a short dwell for the purpose stated, which may require only about 5 seconds, movement of container 10 is resumed to immerse the fill pipe 24b in the melt M below its surface. In this position, the container 10 and mold assembly 22 are further evacuated through conduit 10d to a higher vacuum required to fill the mold.

The melt M from the source 26 is countergravity cast through fill tube 24b into the article molding cavities 31 by evacuation of the container 10 and thus article molding cavities 31 via pump V' and conduit 10d to a sufficient degree to draw melt from the source 26 upwardly into the molding cavities 31 into the risers 31c. For example, a vacuum level of 10 inches of Hg in the container 10 can be used to cast 45 pounds of INCO 738 nickel base alloy in 4 seconds into the four (4) molding cavities 31 and associated risers and ingate passages similar to those shown in FIG. 1.

The high vacuum is maintained in the container 10 until at least the melt is solidified beyond the ingate passages 34 to the cavities 31. At that time, the container 10 can be backfilled with argon or other nonreactive gas through conduit 10e and can be moved by hydraulic actuator 70 and arm 72 to withdraw the fill tube 24b from the melt M. Alternately, the vacuum can be maintained until the melt in the molding cavities 31 is fully directionally solidified. Melt-filled mold assembly 22 in the closed container 10 together can be moved by suitable machinery to another site remote from the melt source 26 where directional solidification of the remaining melt in the cavities 31 can occur.

The melt is directionally solidified as a polycrystalline columnar grained casting in each article molding cavity 31 by virtue of the unidirectional heat removal effected by the chill member 20 contacting the melt in the lowermost nucleation and growth cavity 36. During solidification of the melt, the container sleeve 10a can be raised a small distance relative to the chill member 20 to expose a lower region of the mold assembly 22 to ambient cooling effects to enhance directional cooling in the article molding cavities 31. Some particulates 60 will exit the container 10 at this time to facilitate cooling.

Figure 3:
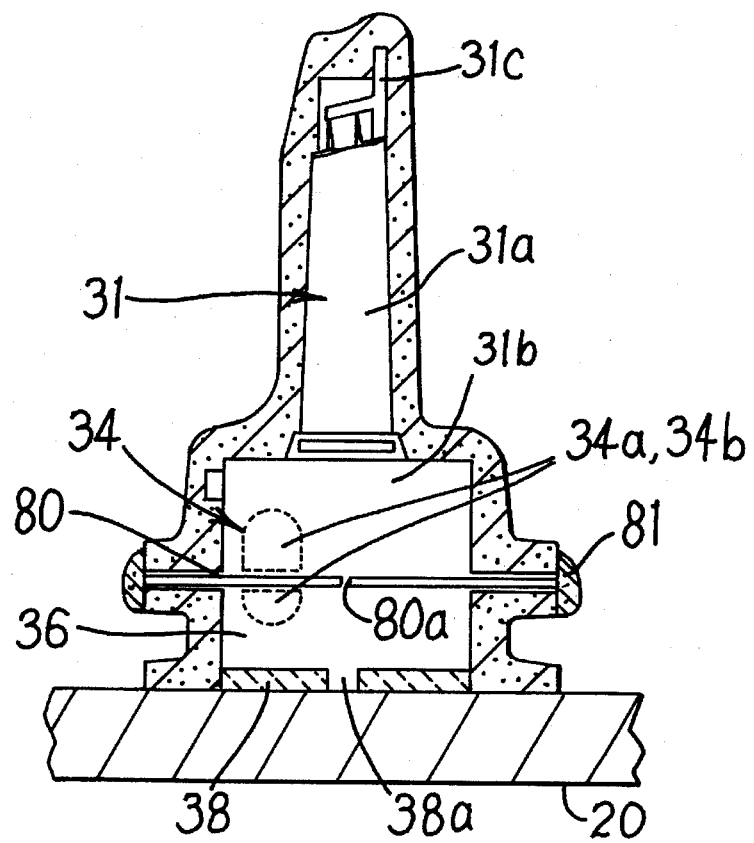
FIG. 3 is a partial sectional view of an article molding cavity of an alternative casting mold for making a single crystal casting.

In another embodiment of the invention for making single crystal castings, the apparatus of FIGS. 1–2 can be used with modification in the manner illustrated in FIG. 3 wherein a radiation transparent crystal selector member 80 is disposed in each grain nucleation and growth cavity 36 so as to span laterally thereacross. The crystal selector member 80 includes a hole or aperture 80a sized to select a single crystal from among multiple grains nucleated and grown in the cavity 36 for further propagation through each article molding cavity 31 to form a single crystal casting. The radiation transparent crystal selector member 80 preferably comprises a quartz plate having a thickness of 0.12 inch and a crystal selector hole or aperture having a diameter of 0.20 inch depending, however, on the casting to be made.

The quartz plate 80 is incorporated in each nucleation and growth cavity 36 after the mold assembly 22 is invested with ceramic mold material and after the fugitive pattern material is removed. In particular, a plastic sheet (not shown) is incorporated in each pattern region that forms a nucleation and growth cavity 36 at a location corresponding to the desired location of the quartz plate 80. After removal of the pattern material from the invested mold assembly, the mold assembly is physically separated at the plastic sheets to bifurcate each nucleation and growth cavity 36. A quartz plate 80 then is positioned at the line of separation and the separated regions of the mold assembly are rejoined using a peripheral ceramic patch 81 as shown in FIG. 3 to fix the quartz plate 80 in position in respective nucleation and growth cavity 36. The mold assembly 22 then can be fired to develop mold strength for casting.

As shown in FIG. 3, the ingate passage 34 is split into upper and lower sections 34a, 34b so as to supply melt both above and below the crystal selector plate 80 to quickly fill each cavity 31. Use of the radiation transparent quartz crystal selector member 80 facilitates transfer of heat to the chill member 20 especially when an airfoil casting having a massive root cavity section 31b (e.g. 1.5×1.5×4 inches) is cast. The melt permeable, fiber thermal insulation member 38 disposed between a grain nucleation and growth cavity 36 and the chill member 20 can include a grain or crystal nucleator passage 38a sized (e.g. 0.20 inch but depends on casting to be made) to provide a few grains or crystals oriented favorably for propagation upwardly to the hole or aperture 80a of the crystal selector plate 80 to aid in the crystal selection process. The casting apparatus and method for making single crystal castings otherwise is the same as described hereabove for making columnar grain castings.

Figure 4:
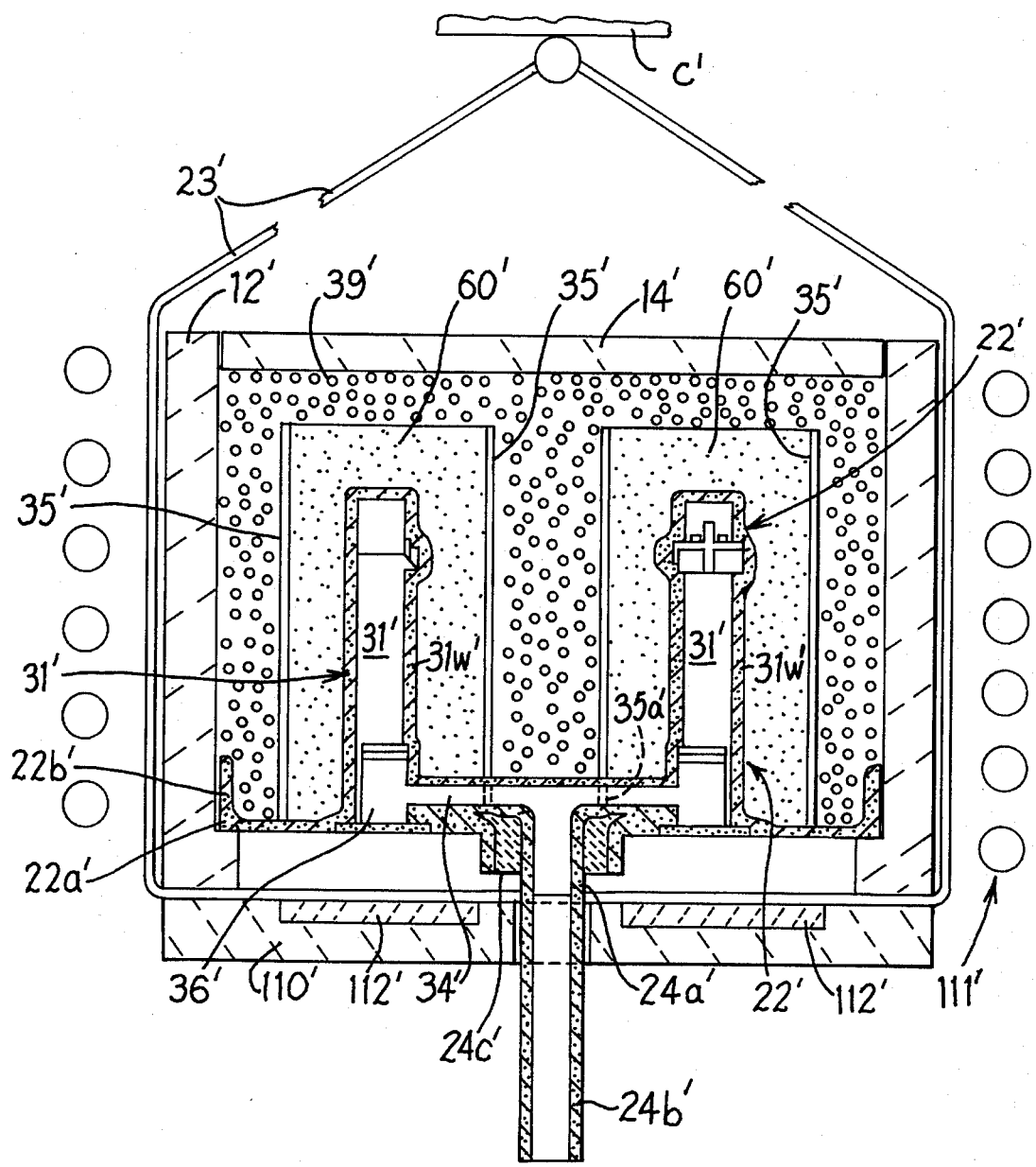
FIG. 4 is a side elevation of another embodiment of apparatus of the invention where the mold assembly in an insulation sleeve is preheated by energization of an induction coil.
Figure 5:
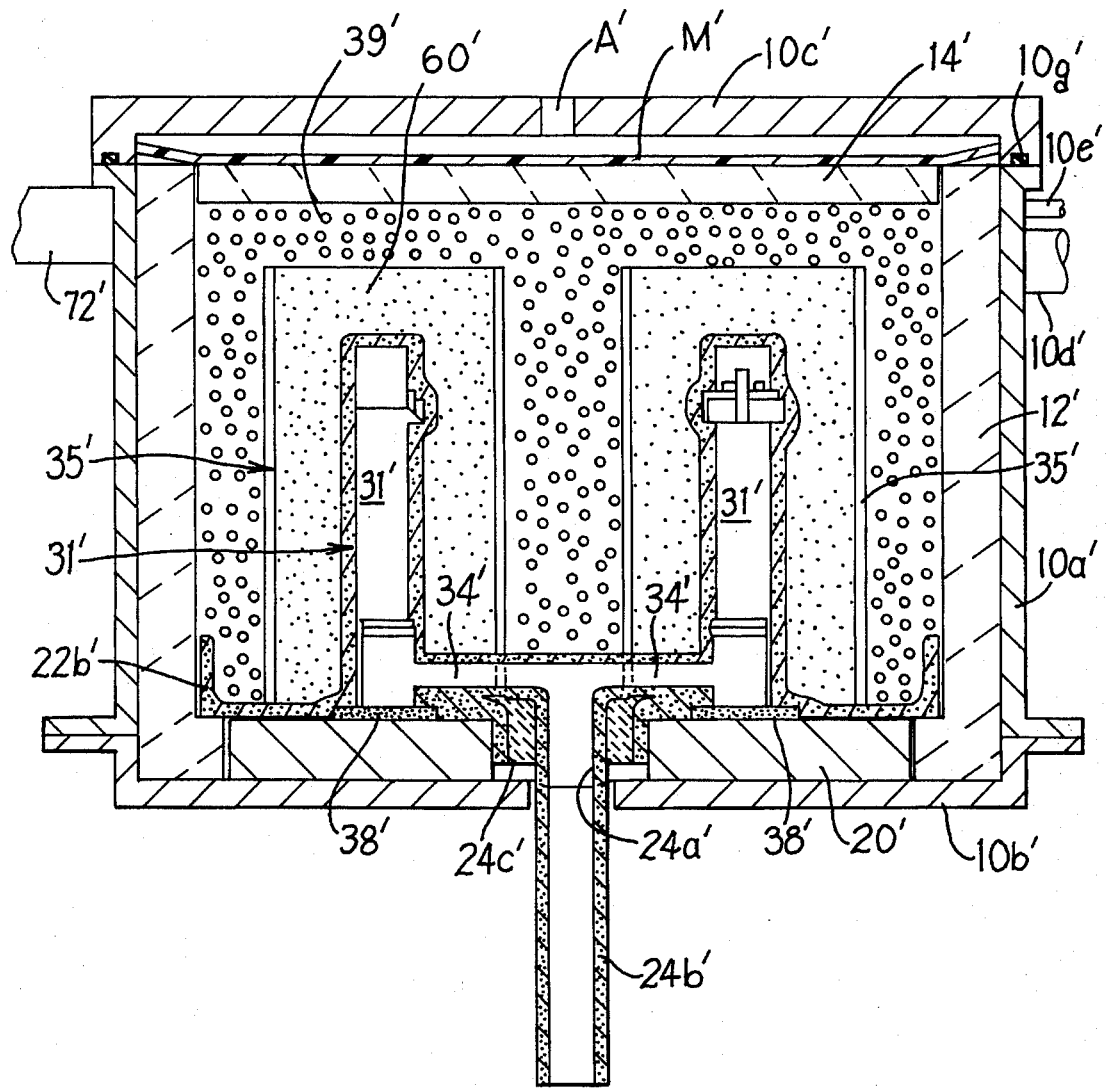
FIG. 5 is a side elevation of the induction preheated mold assembly of FIG. 5 placed on a chill member for casting and directional solidification.

Another embodiment of the present invention is illustrated in FIGS. 4–5 for making directionally solidified castings where like reference numerals primed are used for like features of FIGS. 1–3 and where the molding cavity walls 31w' are heated to desired casting temperature in a manner different from that of FIGS. 1–3. In particular, in FIG. 4, each molding cavity 31' is surrounded by a SiC tubular susceptor 35' that includes a passage 35a' for each ingate passage 34' and is filled with SiC particulates 60' about the mold cavity walls 31w'. Alternately, two concentric SiC susceptors (not shown) can be used to define an annular space within which a plurality of molding cavities 31' are disposed in circumferential array Mold 31', particulates 60' and susceptors 35' may be preheated somewhat.

The SiC susceptors 35' are in turn surrounded or embedded in hollow alumina insulation material, such as insulation spheres or beads 39'. The mold assembly 22' includes an enlarged base 22a' with an upturned lip 22b' coextensive with the inner diameter of the fiber thermal insulation sleeve 12' in a manner that the SiC susceptors 35' SiC particulates 60' and alumina spheres 39' are disposed on the base 22a'. The lip 22b' is not essential as long as base 22a' overlaps sleeve 12'.

The mold assembly 22' and fiber insulation sleeve 12' initially are assembled and placed on a Kaowool® insulating board (greater than 1 inch thick) 110' that comprises separate semi-annular pieces mated at a diametral line. SiC susceptor plates 112' may optionally be provided and are also heated by induction coil 111' to provide more heat to the lower part of the mold assembly 22'. The container 12' is filled with spheres 39' and covered with insulation cover 14'. The resulting assembly is carried in a sling or belt 23' of overhead crane C' with the sling or belt 23' outside of the bottom opening of the sleeve 12' and is disposed by the crane sling or belt 23' in a conventional induction coil 111' that, in turn, is located above the crucible enclosure (not shown but like enclosure 27 of FIG. 1). The induction coil 111' is energized to inductively heat the SiC susceptors 35' and 112'. The heat of susceptors in turn heats the SiC particulates 60' and bottom of mold assembly 22' so as to heat the mold cavity walls 31w' to the desired casting temperature above the melting temperature of the metallic melt being cast. The SiC particulates 60' are not substantially inductively heated as a result of their small size (e.g. 50 mesh). The alumina insulation spheres 39' provide thermal insulation about the susceptors 35' so that most the heat is directed toward the particulates 60' and casting mold assembly 22'.

When the molding cavity walls 31w' are at the selected casting temperature, the semi-annular pieces of insulation block 110' are withdrawn. The preheated mold assembly 22' in sleeve 12' is then lowered by sling or belt 23' onto the underlying chill member 20' in the container 10' as shown in FIG. 5 for countergravity casting of the melt into the article molding cavities 31' and directional solidification in the manner described hereabove either as columnar grain or single crystal castings.

After sleeve 12' is lowered into container 10', the refractory sling 23' is released from the overhead crane C' and remains about the sides, bottom and top cover 14' of sleeve 12', although the sling is not shown in FIG. 5 for convenience. Countergravity casting of the melt M into the molding cavities 31' is achieved by closing top 10c', lowering the sealed container 10' using hydraulic actuator 70' and arm 72' toward the underlying crucible enclosure with establishment of vacuum therein in the manner described hereabove with respect to FIGS. 1–2. After casting and solidification of ingate passage 34', the vacuum is released, the closed container 10 is raised, and transported to a remote site for directional solidification as described previously.

The embodiment of FIGS. 4–5 is especially useful for preheating, casting, and directionally solidifying large airfoil shaped molding cavity regions 30a having, for example, an airfoil length of 10 inches and massive root with a thickness of 1.5 inches.

While the invention has been described in terms of specific embodiments thereof, it is not intended to be limited thereto but rather only to the extent set forth hereafter in the claims which follow.

The embodiments of the invention in which an exclusive property or privilege is claimed are defined as follows:

1. Method of directional solidification of a melt, comprising preheating refractory particulates above a melt casting temperature apart from a casting mold, thru placing the preheated refractory particulates about at least one article molding cavity region of a casting mold, heating the article molding cavity region of the casting mold to said melt casting temperature by heat from the particulates, communicating the article molding cavity region to a heat removal member in a manner to directionally solidify melt introduced therein, and introducing the melt to the article molding cavity region in communication with the heat removal member.

2. The method of claim 1 wherein the particulates comprise silicon carbide particulates.

3. The method of claim 1 including disposing a melt permeable, insulation member between a mold grain nucleation and growth region located between the article molding cavity region and the heat removal member.

4. The method of claim 3 wherein the thermal insulation member includes a crystal nucleator passage therein.

5. The method of claim 1 wherein the casting mold is disposed on a chill member having a space with a mold fill tube extending downwardly through the space in the chill member for engagement with a source of the melt.

6. The method of claim 5 including evacuating the article molding cavity sufficiently to countergravity cast the molten material from the source through the fill tube and into the article molding cavity for directional solidification.

7. Method of directional solidification of a melt, comprising providing refractory particulates about at least one article molding cavity region of a casting mold, said particulates being at an elevated temperature above a melt casting temperature, heating the article molding cavity region of the casting mold to the melt casting temperature by heat from the particulates, communicating the article molding cavity region to a heat removal member with a radiation transparent crystal selector member disposed in a mold grain nucleation and growth region between said article molding cavity and said heat removal member in a manner to select a single crystal for propagation in said article molding cavity during directional solidification of melt introduced therein, and introducing the melt to the article molding cavity region in communication with the heat removal member.

8. The method of claim 7 wherein the radiation transparent crystal selector member comprises quartz.

9. Apparatus for directional solidification of a melt, comprising a casting mold having an article molding cavity region heated to an elevated temperature less than a melt casting temperature and in which the melt is directionally solidified, a heat removal member with which the article molding cavity is communicated by a grain nucleation and growth cavity of said mold for removing heat from the melt therein in a manner to directionally solidify the melt, a radiation transparent crystal selector member disposed in said grain nucleation and growth cavity and including a passage effective to select a single crystal for propagation in said article molding cavity, and particulates disposed about said region and heated to a temperature above the melting temperature of material to be cast to heat said region to an adequate temperature for directional solidification.

10. The apparatus of claim 9 including means for heating the particulates above the melt casting temperature.

11. The apparatus of claim 9 including induction coil means for heating the particulates in-situ about the article molding cavity of the casting mold.

12. The apparatus of claim 9 wherein the particulates comprise silicon carbide particulates.

13. The apparatus of claim 9 wherein the particulates are disposed in a tubular susceptor disposed about the article molding cavity and heated to elevated temperature by induction coil means.

14. The apparatus of claim 9 wherein the radiation transparent crystal selector member comprises quartz.

15. The apparatus of claim 9 wherein the mold includes a grain nucleation and growth cavity communicated to one or more article molding cavities and to the chill member and a melt permeable, thermal insulation member disposed between the grain nucleation and growth cavity and the chill member.

16. The apparatus of claim 15 wherein the thermal insulation member includes a crystal nucleator passage therein.

17. The apparatus of claim 9 wherein the heat removal member comprises a chill member having a space and the casting mold includes a fill tube extending downwardly through the space in the annular chill member for engagement with a source of the melt.

18. The apparatus of claim 17 including means for evacuating the article molding cavity sufficiently to draw the melt from the source through the fill tube and into the article molding cavity for directional solidification.

19. A single crystal casting mold, comprising at least one article molding cavity having a shape to form a casting, a grain nucleation and growth cavity communicated to the article molding cavity and a radiation transparent crystal selector member disposed in the grain nucleation and growth cavity and having a passage for selecting a single grain nucleated in the grain nucleation cavity for propagation through melt in the article molding cavity.

20. The mold of claim 19 wherein the radiation transparent crystal selector member comprises quartz.

21. The mold of claim 19 wherein the radiation transparent crystal selector member comprises an apertured plate spanning across the grain nucleation and growth cavity.

22. An assembly for directional solidification, comprising a mold having at least one article molding cavity with a shape to form a casting and a grain nucleation and growth cavity communicated to the article molding cavity, a heat removal member engaged with the mold and communicated to the grain nucleation and growth cavity, a melt permeable, thermal insulation member disposed between the grain nucleation and growth cavity and the heat removal member, and a radiation transparent crystal selector member disposed in said nucleation and growth cavity between said thermal insulation member and said article molding cavity.

23. The assembly of claim 22 wherein the thermal insulation member comprises fibrous thermal insulation.

* * * * *